(12) United States Patent
Oda et al.

(10) Patent No.: US 7,012,355 B2
(45) Date of Patent: Mar. 14, 2006

(54) CRYSTAL UNIT

(75) Inventors: Seiji Oda, Saitama (JP); Mitoshi Umeki, Saitama (JP); Hiroshi Uehara, Saitama (JP); Keisuke Hirano, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 194 days.

(21) Appl. No.: 10/603,485

(22) Filed: Jun. 25, 2003

(65) Prior Publication Data
US 2004/0036380 A1 Feb. 26, 2004

(30) Foreign Application Priority Data

Jun. 25, 2002 (JP) .............................. 2002-185081
Aug. 6, 2002 (JP) .............................. 2002-228967

(51) Int. Cl.
*H01L 41/08* (2006.01)

(52) U.S. Cl. ...................... 310/348; 310/320; 310/324; 310/360; 310/365; 310/367; 310/368

(58) Field of Classification Search ................ 310/320, 310/324, 348, 352, 353, 360, 361, 365, 367, 310/368; 333/154, 155, 158
See application file for complete search history.

(56) References Cited

U.S. PATENT DOCUMENTS

| 2,161,980 | A | * | 6/1939 | Runge et al. ................ 310/348 |
| 5,376,861 | A | * | 12/1994 | Nakamura et al. .......... 310/361 |
| 5,481,154 | A | * | 1/1996 | Kaida .......................... 310/368 |
| 5,841,217 | A | * | 11/1998 | Kizaki et al. ................ 310/348 |

FOREIGN PATENT DOCUMENTS

| JP | 53-132988 | * | 9/1978 |
| JP | 4-196613 | * | 7/1992 |
| JP | 8-162875 | * | 6/1996 |

* cited by examiner

*Primary Examiner*—Thomas M. Dougherty
(74) *Attorney, Agent, or Firm*—Knobbe, Martens, Olson & Bear, LLP

(57) ABSTRACT

A crystal unit has a crystal blank having a hole defined in at least one principal surface thereof, the crystal blank having a region of a reduced thickness including the hole, the region serving as a vibrating region, excitation electrodes disposed respectively on opposite principal surfaces of the crystal blank in the vibrating region, extension electrodes extending respectively from the excitation electrodes to respective opposite ends of one side of the crystal blank, and a casing having a step formed therein. The opposite ends of the one side of the crystal blank are fixed to the step by a joining member. The crystal blank has a notched portion defined therein between the one side and the vibrating region, the notched portion extending from at least one transverse edge of the crystal blank in a transverse direction of the crystal blank.

10 Claims, 5 Drawing Sheets

CRYSTAL UNIT

BACKGROUND OF THE INVENTION

1. Field of the Invention

The present invention relates to a quartz crystal unit, and more particularly to a crystal unit having a high resonant frequency of 100 MHz or higher.

2. Description of the Related Art

Crystal units which have a quartz crystal blank housed in a casing are widely used as a frequency or time reference source for oscillators in various communication devices. In recent years, as the frequency band for use in communications is shifted to higher frequencies, crystal units are required to have a higher resonant frequency. To meet this requirement, there has been developed a crystal unit comprising a crystal blank which has a recess defined in a vibrating region thereof to reduce the thickness of the crystal blank at the recess for a higher resonant frequency, and which also has a relatively thick portion around the recess to hold the vibrating region for desired mechanical strength.

FIG. 1 shows such a conventional crystal unit in exploded perspective. As shown in FIG. 1, the conventional crystal unit comprises casing 1 made of ceramics or the like and having a recess defined therein, and quartz crystal blank 2 housed in casing 1. Casing 1 is substantially in the shape of a rectangular parallelepiped, and crystal blank 2 is of a substantially rectangular shape. Casing 1 has a step on one side of the recess, and a pair of connecting terminals 3 is disposed on opposite ends of an upper surface of the step for electrically connecting to crystal blank 2. Although not shown, a pair of mounting terminals for surface-mounting this crystal unit on a wiring board is formed on an outer surface of casing 1. The mounting terminals are electrically connected to connecting terminals 3 through via holes defined in casing 1.

Structural details of crystal blank 2 are shown in FIGS. 2A and 2B. Crystal blank 2 typically comprises an AT-cut quartz crystal blank. The AT-cut crystal blank has its resonant frequency determined by its thickness such that the thinner the crystal blank, the higher the resonant frequency. For crystal blank 2 to have a resonant frequency in excess of 100 MHz, crystal blank 2 has hole 4 defined centrally on one principal surface thereof to make the thickness of crystal blank 2 at the bottom of hole 4 smaller than a peripheral region around hole 4, the reduced-thickness region serving as a vibrating region. In the vibrating region, excitation electrodes 5 are formed respectively on both principal surfaces of crystal blank 2. From excitation electrodes 5, there extend respective extension electrodes 6 toward respective opposite ends of one shorter side of crystal blank 2. Extension electrodes 6 are associated with respective connecting terminals 3 on the step of casing 1. Extension electrode 6 disposed on the upper surface, as shown, of crystal blank 2 is folded back onto the lower surface, as shown, of crystal blank 2 at the above-described shorter side thereof. The opposite ends of the above-described shorter side of crystal blank 2 are fixed to respective connecting terminals 3 by joining members 7 such as of an electrically conductive adhesive, thereby holding crystal blank 2 horizontally in the recess in casing 1 and establishing electrical connection of connecting terminals 3 to extension electrodes 6, so that the mounting terminals on the outer surface of casing 1 are electrically connected to respective excitation electrodes 5 on crystal blank 2. The electrically conductive adhesive comprises an adhesive primarily composed of a relatively hard synthetic resin such as epoxy resin or the like.

After crystal blank 2 is fixed to the step in the recess, the opening of the recess is sealed by a cover (not sown), thus hermetically sealing crystal blank 2 in casing 1.

With the above conventional crystal unit, the laminated ceramics of casing 1 and crystal blank 2 have widely different thermal expansion coefficients. Specifically, the ceramics of casing 1 has a thermal expansion coefficient of about $7.0 \times 10^{-6}/°$ C., and crystal blank 2 has a thermal expansion coefficient in the range from 14.5 to $16.9 \times 10^{-6}/°$ C. Therefore, when the crystal unit is exposed to a high temperature environment, crystal blank 2 is strained due to the difference between the thermal expansion coefficients of casing 1 and crystal blank 2.

FIGS. 3A and 3B show how crystal blank 2 is strained due to the difference between the thermal expansion coefficients of casing 1 and crystal blank 2.

Since crystal blank 2 is held at the opposite ends of one shorter side thereof on casing 1 here, stresses are produced in the transverse direction of crystal blank 2 as shown in FIGS. 3A and 3B. Since crystal blank 2 has a larger thermal expansion coefficient, crystal blank 2 is subjected to compressive stresses. These applied compressive stresses concentrate on the thinner region of crystal blank 2, i.e., the vibrating region which is provided by hole 4 for a higher resonant frequency, resulting in a larger strain in the vibrating region. Usually, the frequency vs. temperature characteristics of the resonant frequency of the AT-cut quartz crystal blank is represented by a cubic curve having an inflection point near the normal temperature of 25° C. As the strain in the vibrating region becomes larger, the frequency vs. temperature characteristics becomes worse, making the oscillating frequency of a crystal oscillator which incorporates the crystal unit, unstable with respect to temperature changes. The strain in the vibrating region also adversely affects other vibrating characteristics of crystal blank 2.

When crystal blank 2 is fixed to the step in the recess in casing 1 by the electrically conductive adhesive, crystal blank 2 tends to be strained by a shrinkage of the electrically conductive adhesive at the time it is thermoset. This strain due to the shrinkage of the electrically conductive adhesive also adversely affects crystal blank 2.

The adverse effects posed by the stresses produced due to the difference in thermal expansion coefficients and the strain caused by a shrinkage of the electrically conductive adhesive manifest themselves as the vibrating region is thinner, i.e., as the resonant frequency of the crystal unit is higher. The adverse effects also manifest themselves as the crystal blank or the crystal unit is required to meet more stringent specifications.

To reduce stresses applied to the crystal blank, it has been practiced to use an electrically conductive adhesive primarily composed of a highly pliable synthetic resin such as silicone resin or the like for thereby allowing the crystal blank to have desired vibrating characteristics. However, the pliable electrically conductive adhesive tends to make the crystal unit less resistant to mechanical shocks that are applied thereto.

SUMMARY OF THE INVENTION

It is therefore an object of the present invention to provide a crystal unit which is capable of suppressing strains that would otherwise be caused by difference in thermal expansion coefficients and a structure by which a crystal blank is held, has excellent vibrating characteristics, is highly resistant to mechanical shocks, and is suitable for operation at higher frequencies.

According to the present invention, the above object can be achieve by a crystal unit having a crystal blank having a hole defined in at least one principal surface thereof, the crystal blank having a region of a reduced thickness including the hole, the region serving as a vibrating region, excitation electrodes disposed respectively on opposite principal surfaces of the crystal blank in the vibrating region, extension electrodes extending respectively from the excitation electrodes to respective opposite ends of one side of the crystal blank, and a casing having a step formed therein, wherein the opposite ends of the one side of the crystal blank are fixed to the step by a joining member, and the crystal blank has a notched portion defined therein between the one side and the vibrating region, the notched portion extending from at least one transverse edge of the crystal blank in a transverse direction of the crystal blank.

With the crystal unit according to the present invention, the crystal blank has the notched portion defined therein which extends from at least one transverse edge thereof between one side of the crystal blank and the vibrating region of the reduced thickness where the excitation electrodes are formed, and the crystal blank is supported at the opposite ends of the one side thereof. Therefore, strains applied to the crystal blank due to the difference in the thermal expansion coefficients concentrate on the supported region of the crystal blank, i.e., the region from the notched portion to the one side of the crystal blank. As a result, no strains are caused in the vibrating region, which is kept flat for better vibrating characteristics. The crystal unit according to the present invention is highly resistant to mechanical shocks because the opposite ends of the one side of the crystal blank can be firmly held in position. According to the present invention, there can also be provided a structure for holding the crystal unit, which is suitable for use with high-frequency crystal units.

DETAILED DESCRIPTION OF THE INVENTION

Figure 1:
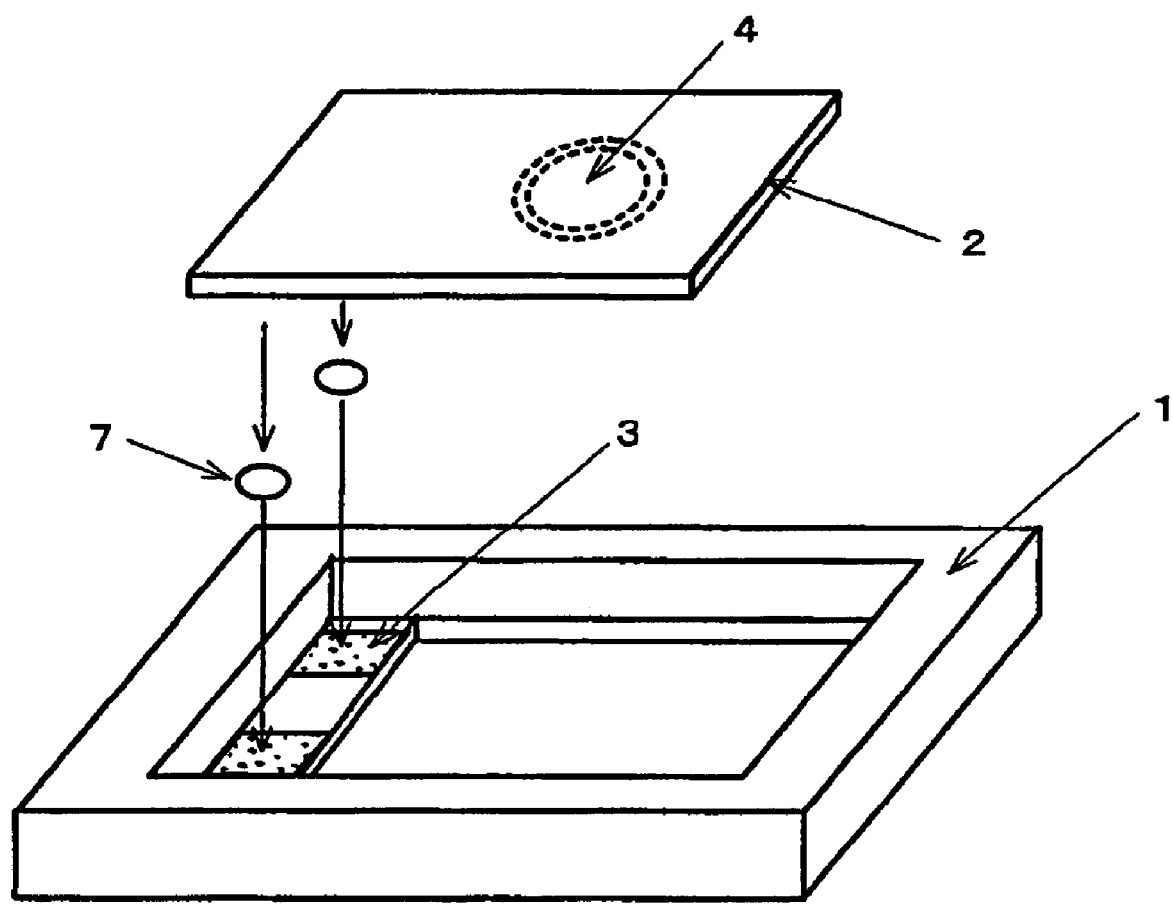
FIG. 1 is an exploded perspective view of an example of a conventional crystal unit.
Figure 2A:
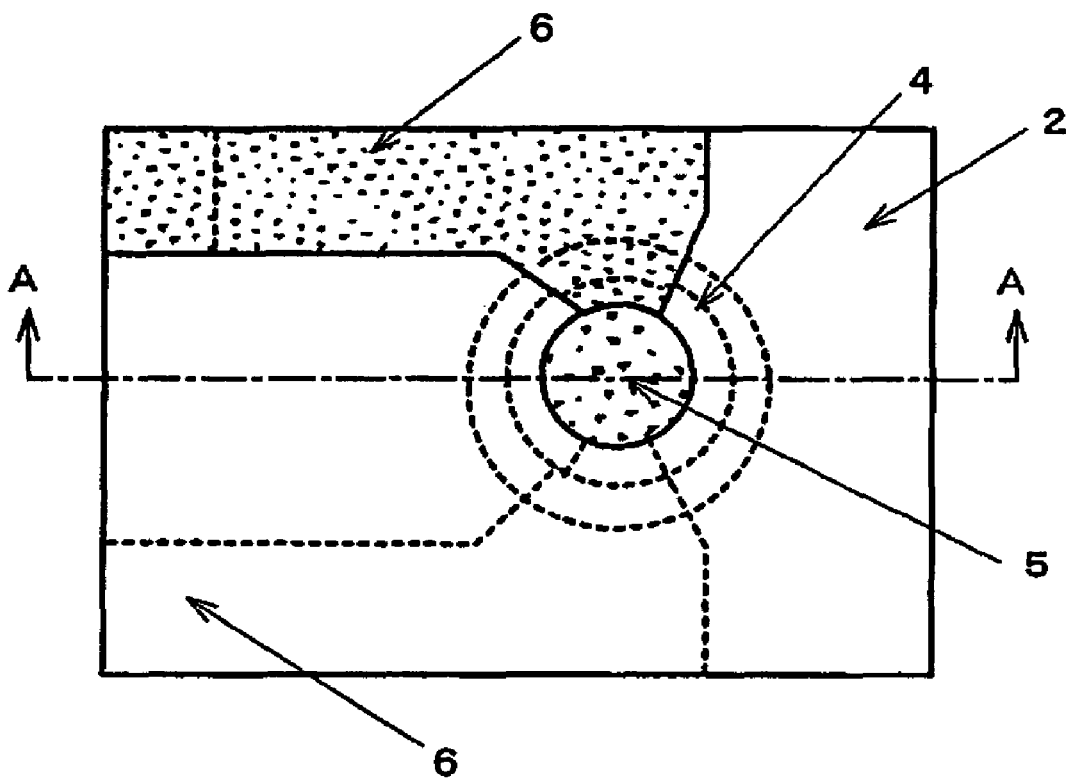
FIG. 2A is a plan view of a crystal blank of the conventional crystal unit.
Figure 2B:
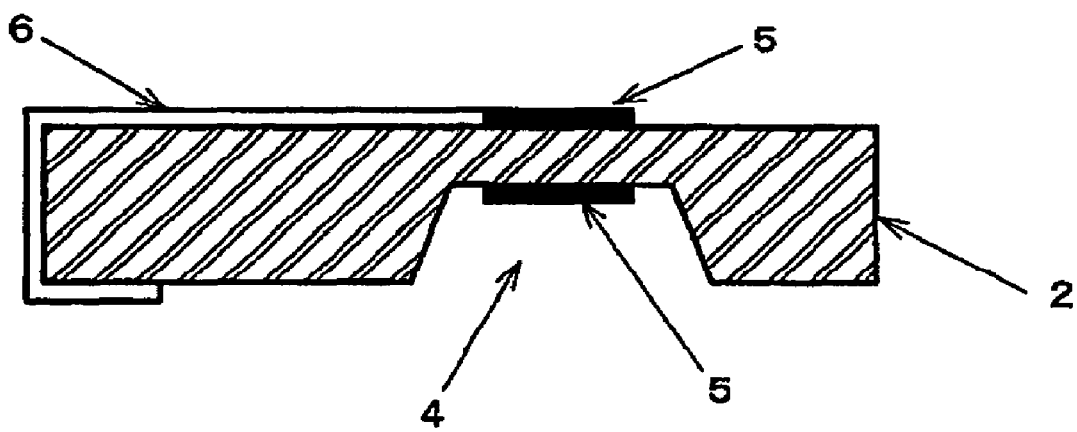
FIG. 2B is a cross-sectional view taken along line A—A of FIG. 2A.
Figure 3A:
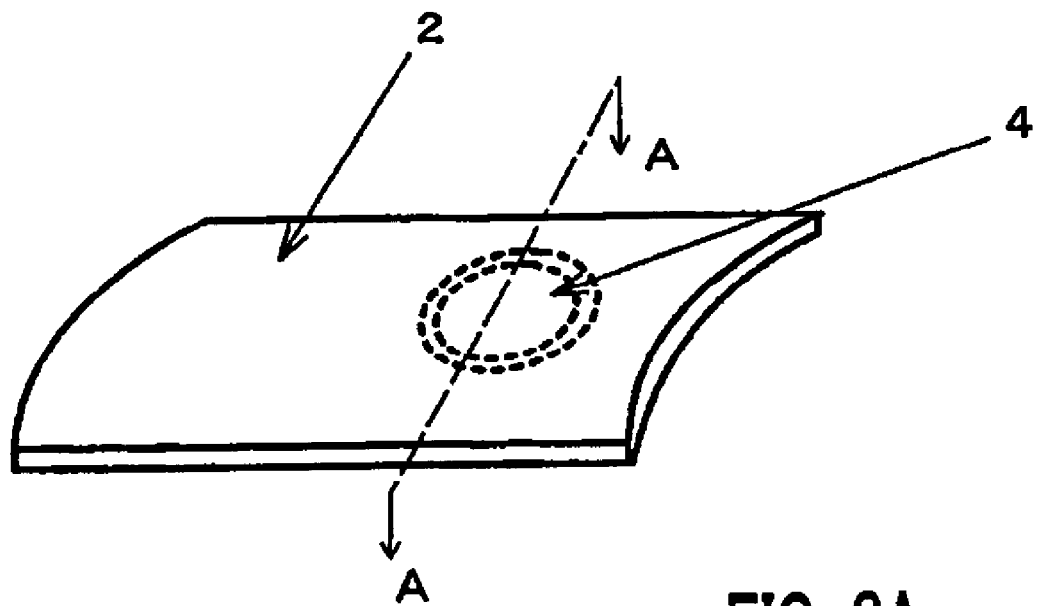
FIG. 3A is a perspective view of the crystal blank when it is placed under stresses.
Figure 3B:
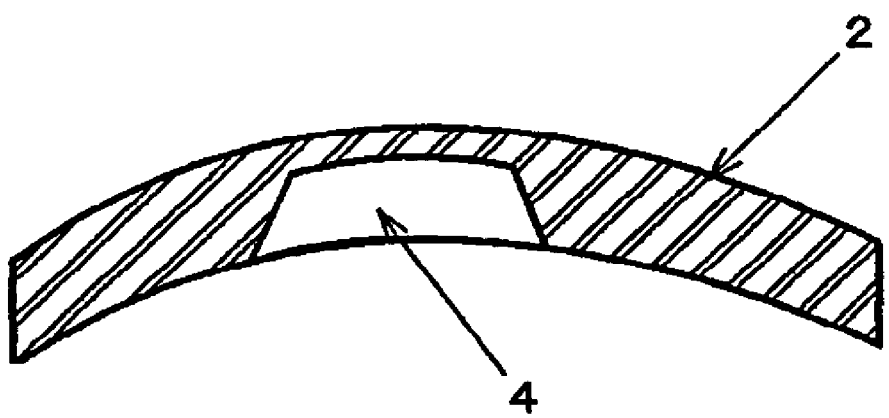
FIG. 3B is a cross-sectional view taken along line A—A of FIG. 3A.
Figure 4:
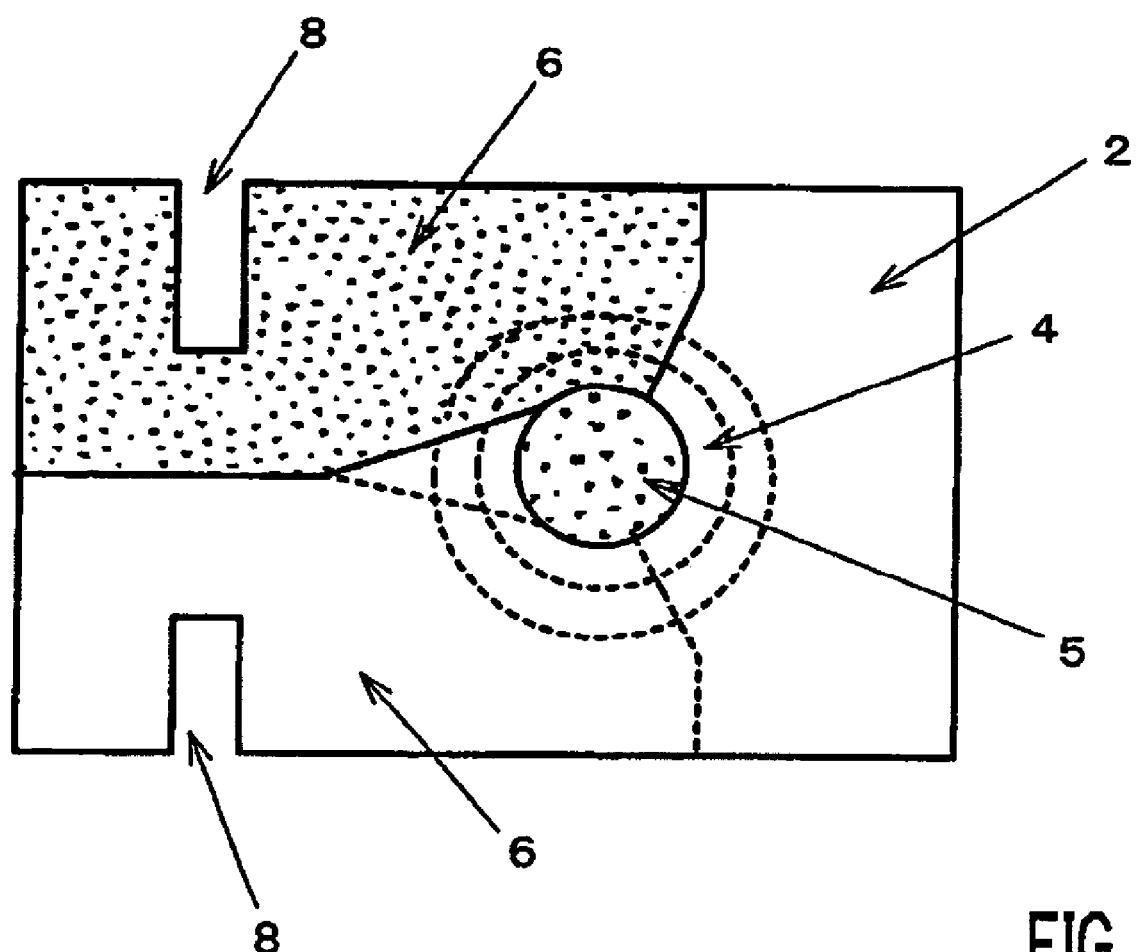
FIG. 4 is a plan view of a crystal blank of a crystal unit according to an embodiment of the present invention.
Figure 5:
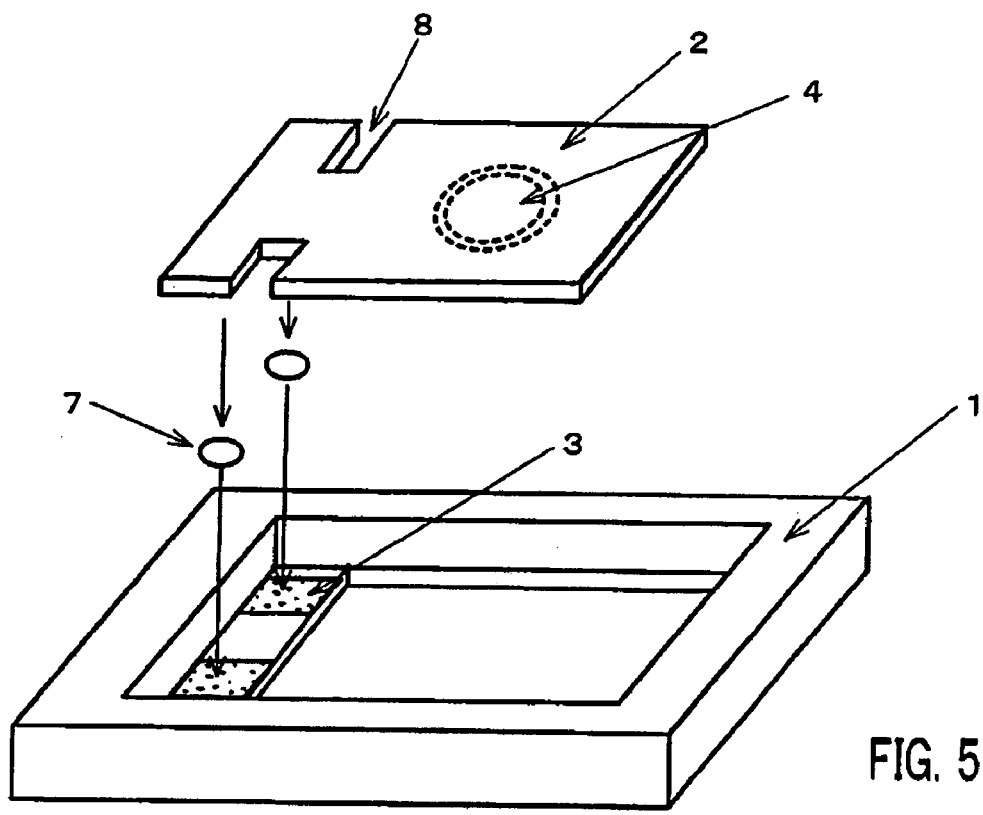
FIG. 5 is an exploded perspective view of the crystal unit according to the embodiment of the present invention.

FIGS. 4 and 5 show a quartz crystal unit according to a preferred embodiment of the present invention. Those parts of the crystal unit shown in FIGS. 4 and 5 which are identical to those shown in FIGS. 1, 2A and 2B are denoted by identical reference characters. The crystal unit according to the present embodiment has a quartz crystal blank housed in a casing, as with the conventional crystal unit described above, but differs from the conventional crystal unit as to structural details of the crystal blank.

FIG. 4 shows crystal blank 2 used in the crystal unit according to the present embodiment. Crystal blank 2 comprises, for example, an AT-cut quartz crystal blank which is of a substantially rectangular shape. Crystal blank 2 has substantially circular hole 4 defined centrally in one principal surface thereof, and has a smaller thickness at the bottom of hole 4 than a peripheral region around hole 4. The reduced-thickness region of crystal blank 2 serves as a vibrating region thereof. Crystal blank 2 has its resonant frequency determined by the thickness thereof in the vibrating region.

In the vibrating region, excitation electrodes 5 are formed respectively on both principal surfaces of crystal blank 2. From excitation electrodes 5, there extend respective extension electrodes 6 toward respective opposite ends of one shorter side of crystal blank 2. Crystal blank 2 has notched portions 8 defined therein between the shorter side to which extension electrodes 6 extend and the vibrating region, notched portions 8 extending transversely from transversely opposite edges of crystal blank 2. Therefore, crystal blank 2 is constricted and has a smaller width in the region where notched portions 8 are defined.

In order for extension electrodes 6 extending from excitation electrodes 5 on both principal surfaces of crystal blank 2 not to be interrupted by notched portions 8, each of extension electrodes 6 is formed in a substantially one half of the principal surface, transversely of crystal blank 2, from the constricted region where notches portions 8 are defined toward one shorter side of crystal blank 2. Extension electrode 6 on the upper surface, as shown in FIG. 4, of crystal blank 2, has an end portion folded back onto the lower surface of crystal blank 2, as with the conventional crystal blank shown in FIG. 2B. In the present embodiment, each of extension electrodes 6 is formed in a wide area from one shorter side of crystal blank 2 toward the constricted region. If both principal surfaces are regarded as a single plane, then extension electrodes 6 are regarded as being formed entirely in the single plane in that area. Therefore, extension electrodes 6 are effective to make up for a reduction in the mechanical strength of crystal blank 2 which is caused by the constricted region including notched portions 8.

As shown in FIG. 5, the crystal unit is held in casing 1 made of ceramics, for example, which is substantially in the shape of a rectangular parallelepiped. Casing 1 has a substantially rectangular recess defined therein. Casing 1 has a step at one end of the recess, and a pair of connecting terminals 3 disposed on an upper surface of the step. The opposite ends of the shorter side of crystal blank 2 to which extension electrodes 6 extend are fixed to respective connecting terminals 3 by electrically conductive adhesive 7, thereby holding crystal blank 2 horizontally in the recess in casing 1. Electrically conductive adhesive 7 functions as a joining member. After crystal blank 2 is fixed to the step in the recess, the open face of the recess is sealed by a cover (not sown), thus hermetically sealing crystal blank 2 in casing 1. As with the conventional crystal unit, a pair of mounting terminals electrically connected to connecting terminals 3 is formed on casing 1.

Figure 6:
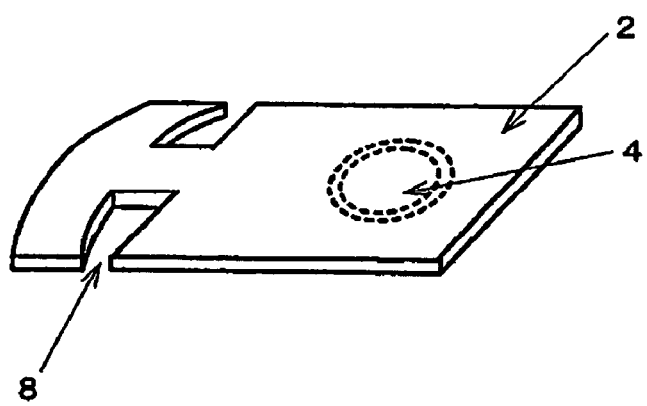
FIG. 6 is a perspective view of the crystal blank when it is placed under stresses.

In this arrangement, as shown in FIG. 6, stresses applied to crystal blank 2 due to the difference between the thermal expansion coefficients of crystal blank 2 and casing 1 are caused by notched portions 8 to concentrate on the end of crystal blank 2 which is coated with the electrically conductive adhesive as the joining members 7. The end of crystal blank 2 is strained or flexed. Since the region from notched portions 8 to the other end of crystal blank 2, including the vibrating region, is isolated by notched portions 8, this region does not suffer stresses and hence is not strained. As a result, crystal blank 2 has its vibrating characteristics including frequency vs. temperature characteristics kept well.

According to the present embodiment, the electrically conductive adhesive may comprise an adhesive mainly composed of a hard synthetic resin such as epoxy resin or polyimides, rather than the highly pliable synthetic resin such as silicone resin or the like. Using the alternative electrically conductive adhesive, crystal blank 2 is secured with increased bonding strength for better resistance to mechanical shocks.

Figure 7:
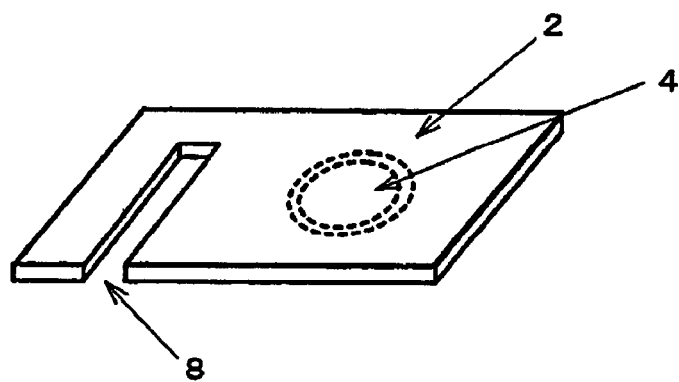
FIG. 7 is a perspective view of a crystal blank of a crystal unit according to another embodiment of the present invention.

While the preferred embodiment of the present invention has been just described, the manner of notched portion 8 in crystal blank 2 is not limited to the above example. As shown in FIG. 7, the crystal blank may has single notched portion 8 defined therein which extends transversely from one longitudinal side of crystal blank 2. Notched portion 8 is of such a length that its tip end extends laterally of and across the vibrating region. The shape of notched portion 8 is effective for strains to be less propagable to the vibrating region, further improving the vibrating characteristics of crystal blank 2.

The material of the joining members 7 by which crystal blank 2 is joined to casing 1 is not limited to the electrically conductive adhesive. Rather, crystal blank 2 may be joined to casing 1 by a brazing material comprising a eutectic alloy having a high bonding strength. Also in this case, since notched portions 8 cut off strains, the crystal unit has excellent vibrating characteristics as with the crystal unit which employs the electrically conductive adhesive. Extension electrodes 6 disposed on the respective principal surfaces of crystal blank 2 may be formed in superposed relation to each to other across crystal blank 2. However, because the region across which extension electrodes 6 are superposed tends to vibrate, causing spurious oscillation, extension electrodes 6 should not be superposed if harmonics of spurious oscillation are close to the vibrating frequency of the intrinsic vibrating region of crystal blank 2.

What is claimed is:

1. A crystal unit comprising:
   a crystal blank having a hole defined in at least one principal surface thereof, said crystal blank having (i) a region of a reduced thickness including said hole, said region serving as a vibrating region, and (ii) a holding region surrounding the vibrating region, said holding region having a thickness greater than that of the vibrating region;
   excitation electrodes disposed respectively on opposite principal surfaces of said crystal blank in said vibrating region;
   extension electrodes extending respectively from said excitation electrodes to respective opposite ends of one side of said crystal blank; and
   a casing having a step formed therein;
   wherein said opposite ends of the one side of the crystal blank are fixed to said step by a joining member, and said crystal blank has a notched portion disposed exclusively in the holding region between said one side and said vibrating region and separated from the vibrating region, said notched portion extending from at least one transverse edge of said crystal blank in a transverse direction of said crystal blank.

2. The crystal unit according to claim 1, wherein said crystal blank comprises an AT-cut crystal blank having a substantially rectangular shape, said one side comprising a shorter side of said crystal blank.

3. The crystal unit according to claim 1, wherein said crystal blank has a pair of said notched portions extending from respective transverse edges of said crystal blank.

4. The crystal unit according to claim 1, wherein said joining member is made of an electrically conductive adhesive.

5. The crystal unit according to claim 4, wherein said electrically conductive adhesive comprises an electrically conductive adhesive mainly composed of epoxy resin or polyimides.

6. The crystal unit according to claim 1, wherein said joining member is made of a brazing material comprising a eutectic alloy.

7. The crystal unit according to claim 1, wherein the sum of areas of said extension electrodes in a region from said notched portion to said one side of the crystal blank is substantially equal to an area of said region on said one principal surface.

8. The crystal unit according to claim 1, wherein said casing is made of ceramics.

9. A crystal unit comprising:
   a crystal blank having a hole defined in at least one principal surface thereof, said crystal blank having a region of a reduced thickness including said hole, said region serving as a vibrating region;
   excitation electrodes disposed respectively on opposite principal surfaces of said crystal blank in said vibrating region;
   extension electrodes extending respectively from said excitation electrodes to respective opposite ends of one side of said crystal blank; and
   a casing having a step formed therein;
   wherein said opposite ends of the one side of the crystal blank are fixed to said step by a joining member, and said crystal blank has a notched portion disposed therein between said one side and said vibrating region in closer proximity to said one side than to said vibrating region, said notched portion extending from at least one transverse edge of said crystal blank in a transverse direction of said crystal blank.

10. The crystal unit according to claim 9, wherein the one side of the crystal blank is fixed exclusively to the casing via the step.

* * * * *